(12) United States Patent
Mizuno et al.

(10) Patent No.: US 7,814,645 B2
(45) Date of Patent: Oct. 19, 2010

(54) MOUNTING APPARATUS MOUNTING SURFACE-MOUNTED DEVICE ON RECEIVING DEVICE USING ULTRASONIC VIBRATION

(75) Inventors: Toru Mizuno, Tokyo (JP); Tomomi Asakura, Tokyo (JP); Yuji Saito, Tokyo (JP); Hiroyuki Takano, Tokyo (JP); Toshinobu Miyagoshi, Tokyo (JP)

(73) Assignee: TDK Corporation, Tokyo (JP)

( * ) Notice: Subject to any disclaimer, the term of this patent is extended or adjusted under 35 U.S.C. 154(b) by 62 days.

(21) Appl. No.: 12/175,770

(22) Filed: Jul. 18, 2008

(65) Prior Publication Data

US 2009/0031558 A1  Feb. 5, 2009

(30) Foreign Application Priority Data

Jul. 30, 2007  (JP) .............................. 2007-197423

(51) Int. Cl.
*B23P 19/00* (2006.01)
(52) U.S. Cl. .............................. 29/740; 29/743; 29/742; 29/739; 29/757; 29/760; 438/120; 257/E21.518; 519/534
(58) Field of Classification Search .................. 29/742, 29/743, 739, 757, 760; 438/120; 257/E21.518; 219/385, 534
See application file for complete search history.

(56) References Cited

U.S. PATENT DOCUMENTS 4,790,067 A * 12/1988 Grindle ........................ 29/748

2005/0227429 A1 * 10/2005 Minamitani et al. ......... 438/222

FOREIGN PATENT DOCUMENTS

| JP | 3368494 | 11/2002 |
|---|---|---|
| JP | 2003-282644 | 10/2003 |
| JP | 2004-87610 | 3/2004 |
| JP | 3747849 | 12/2005 |

* cited by examiner

*Primary Examiner*—Derris H Banks
*Assistant Examiner*—Azm Parvez
(74) *Attorney, Agent, or Firm*—Oblon, Spivak, McClelland, Maier & Neustadt, L.L.P.

(57) ABSTRACT

A mounting apparatus applies ultrasonic vibration exactly to a junction between a SMD and a SMD receiving device and maintains the junction at the suitable temperature, in simple construction in ultrasonic bonding of the SMD and the SMD receiving device held by holding unit. This includes SMD holding unit, SMD receiving device holding unit, moving unit moving at least one of the SMD holding unit and SMD receiving device holding units to contact each other, vibration generating unit applying ultrasonic vibration to the a contact portion between the SMD and the SMD receiving device, pressing unit applying an bias force between the SMD and SMD receiving device, heating unit arranged movably so as to surround in a noncontact manner a portion of the SMD holding unit near the SMD and heating the SMD holding unit, and interlocking unit interlocking the heating unit with the SMD holding unit.

7 Claims, 7 Drawing Sheets

MOUNTING APPARATUS MOUNTING SURFACE-MOUNTED DEVICE ON RECEIVING DEVICE USING ULTRASONIC VIBRATION

BACKGROUND OF THE INVENTION

1. Field of the Invention

The present invention relates to a mounting apparatus to mount a surface-mounted device (hereinafter referred to as SMD) onto a SMD receiving device, in which the SMD and the SMD receiving device are contacted and then ultrasonic vibration is applied thereto to bond the SMD and the SMD receiving device each other.

2. Related Background Art

Conventionally, ultrasonic bonding has been used as a method of mounting a SMD, which is an electronic device such as a flip chip, on a SMD receiving device such as a circuit board. The ultrasonic bonding applies ultrasonic vibration while a SMD is pressed onto a SMD receiving device by a bonding tool, and causes a friction between junction surfaces of the SMD and SMD receiving device to bond both devices.

A conventional mounting apparatus using ultrasonic vibration will be described with referring to drawings. FIGS. 5A and 5B are diagrams showing steps of mounting using a conventional mounting apparatus. A conventional mounting apparatus 801 includes a holding unit 808 for holding an electronic device 809, an infrared irradiation lamp 818 for heating the electronic device 809 which is arranged below the holding unit 808 and is held by the holding unit 808, a bonding stage 803 on which a circuit board 804 on a top face of which an electrode 804a is provided is placed, and a vibrator 811 which is connected to the holding unit 808 and applies vibration to the electronic device 809.

In the mounting apparatus 801 with the above-mentioned construction, the holding unit 808 holds the electronic device 809 by using a suction, and the infrared irradiation lamp 818 heats the gold electrode 809a of the electronic device 809 from underneath (FIG. 5A).

Next, the mounting apparatus 801 brings the holding unit 808 holding the heated electronic device 809 close to the bonding stage 803, and while the gold electrode 809a of the electronic device 809 and the electrode 804a of the circuit board 804 are contacted and pressed with each other, applies ultrasonic vibration from the vibrator 811 between the gold electrode 809a and electrode 804a to bond and complete mounting of them (FIG. 5B) (refer to Japanese Patent Application Laid-Open No. 2003-197683).

In addition, as another example of the conventional mounting apparatus, there is a bonding apparatus which connects an electronic device with a circuit board using a bonding material, such as a solder bump. This mounting apparatus includes a laser equipment and has construction of bonding an electronic device and a circuit board by irradiating holding unit with a laser beam without irradiating the electronic device directly with a laser beam, and melting the bonding material through the holding unit and electronic device (refer to Japanese Patent No. 3368494).

When a SMD is mounted on a SMD receiving device by ultrasonic bonding as mentioned above, it is preferable to heat the SMD in order to strengthen the bonding strength.

As a result of wholehearted research, the present inventors have found that, in a mounting apparatus which is equipped with a heating unit in SMD holding unit, an oscillation characteristic of the SMD holding unit changes due to the difference between the materials of the heating unit and SMD holding unit, and hence, it is difficult to apply predetermined ultrasonic vibration between the SMD and the SMD receiving device. Therefore, the mounting apparatus equipped with the SMD holding unit which is not affected by the change in the oscillation characteristic is required.

Japanese Patent Application Laid-Open No. 2003-197683 relates to a mounting apparatus in which the infrared irradiation lamp 818 and the vibrator 811 are spaced apart from each other, and is not affected by the change in the oscillation characteristic of the holding unit 808. By the way, this mounting apparatus heats the electronic device 809, thereafter moves the holding unit 808 to the bonding stage 803, and bonds the electronic device 809 and circuit board 804. However, in this construction, it is difficult to perform the bonding at temperature suitable for ultrasonic bonding since the temperature of the heated electronic device 809 drops while it is moved, so that the electronic device and the circuit board may not reliably be bonded.

If the electronic device 809 is miniaturized further from now on and dimensions of the holding unit 808 is downsized, the heat radiation from the holding unit 808 will be enhanced, and it would be expected that it becomes much more difficult to maintain the electronic device at the predetermined temperature.

In addition, it is conceivable to provide the laser equipment disclosed in Japanese Patent No. 3368494 in an ultrasonic bonding apparatus like that disclosed in Japanese Patent Application Laid-Open No. 2003-197683 to adopt such construction of radiating holding unit with a laser beam and heating it. However, when the laser beam is used, although it is possible to heat a specific position of the holding unit, it is difficult to heat a certain region uniformly. Furthermore, when the laser equipment is mounted on the holding unit, an oscillation characteristic of the holding unit which transmits ultrasonic vibration to an electronic device may change, and hence, it becomes difficult to give the predetermined ultrasonic vibration between the electronic device and a circuit board.

Moreover, when the laser equipment is adopted, construction of a mounting apparatus becomes complicated or it is difficult to irradiate with the laser beam the holding unit which moves so as to transfer the electronic device. In consequence, it is difficult to maintain the electronic device in temperature suitable for ultrasonic bonding, so that the electronic device and the circuit board may not reliably be bonded.

SUMMARY OF THE INVENTION

The present invention is made in view of the above-mentioned problems, and provides a mounting apparatus which can apply ultrasonic vibration exactly to a junction of a SMD and a SMD receiving device, and can maintain the junction at suitable junction temperature for ultrasonic bonding of the SMD held by SMD holding unit and the SMD receiving device.

In order to solve the above-mentioned problems, according to the first aspect of the present invention, a mounting apparatus which mounts a SMD on a SMD receiving device using ultrasonic vibration comprises: a SMD holding unit holding the SMD, a SMD receiving device holding unit holding the SMD receiving device; a moving unit moving at least one of the SMD holding unit and the SMD receiving device holding unit toward the other so as to contact the SMD with SMD receiving device; a vibration generating unit applying ultrasonic vibration to a contact portion between the SMD held by the SMD holding unit and the SMD receiving device held by the SMD receiving device holding unit; a pressing unit applying a bias force between the SMD and SMD receiving device; a heating unit being arranged movably so as to surround in a noncontact manner a portion of the SMD holding unit near the SMD held by the SMD holding unit, and heating the SMD holding unit; and an interlocking unit interlocking the heating unit with the SMD holding unit.

In a second aspect of the mounting apparatus of the present invention, the mounting apparatus further comprises an interlock release unit releasing the interlock of the heating unit lest the heating unit and SMD receiving device holding unit holding the SMD receiving device should approach mutually more nearly than a predetermined distance.

In a third aspect of the mounting apparatus of the present invention, the SMD holding unit comprises a suction nozzle which holds the SMD by a suction force, and that the heating unit comprises a heater member of a toroidal shape which surrounds an outer peripheral surface of the suction nozzle.

In addition, in a fourth aspect of the mounting apparatus of the present invention, the interlock release unit comprises a regulating member which locks the heating unit.

In a fifth aspect of the mounting apparatus of the present invention, the mounting apparatus comprises a thermal shield unit shielding heat from the heating unit to the vibration generating unit.

Furthermore, in a sixth aspect of the mounting apparatus of the present invention, the thermal shield unit comprises a tabular member extending between the heating unit and vibration generating unit.

In a seventh aspect of the mounting apparatus of the present invention, the thermal shield unit comprises an air supply portion which supplies air to the vibration generating unit.

In an eighth aspect of the mounting apparatus of the present invention, the thermal shield unit comprises an air supply portion which forms airflow between the heating unit and vibration generating unit.

According to the present invention, since the heating unit arranged so as to surround in a noncontact manner the SMD holding unit is adopted, it is possible to transmit ultrasonic vibration from the vibration generating member to a junction between the SMD and SMD receiving device while the oscillation characteristic is not affected by the heating unit.

Furthermore, since the interlocking unit interlocking the heating unit with the SMD holding unit is provided and the electronic device can be heated until just before mounting, it is possible to maintain the SMD at the temperature suitable for ultrasonic bonding to perform ultrasonic bonding of the SMD and SMD receiving device positively.

DESCRIPTION OF THE PREFERRED EMBODIMENTS

Figure 1A:
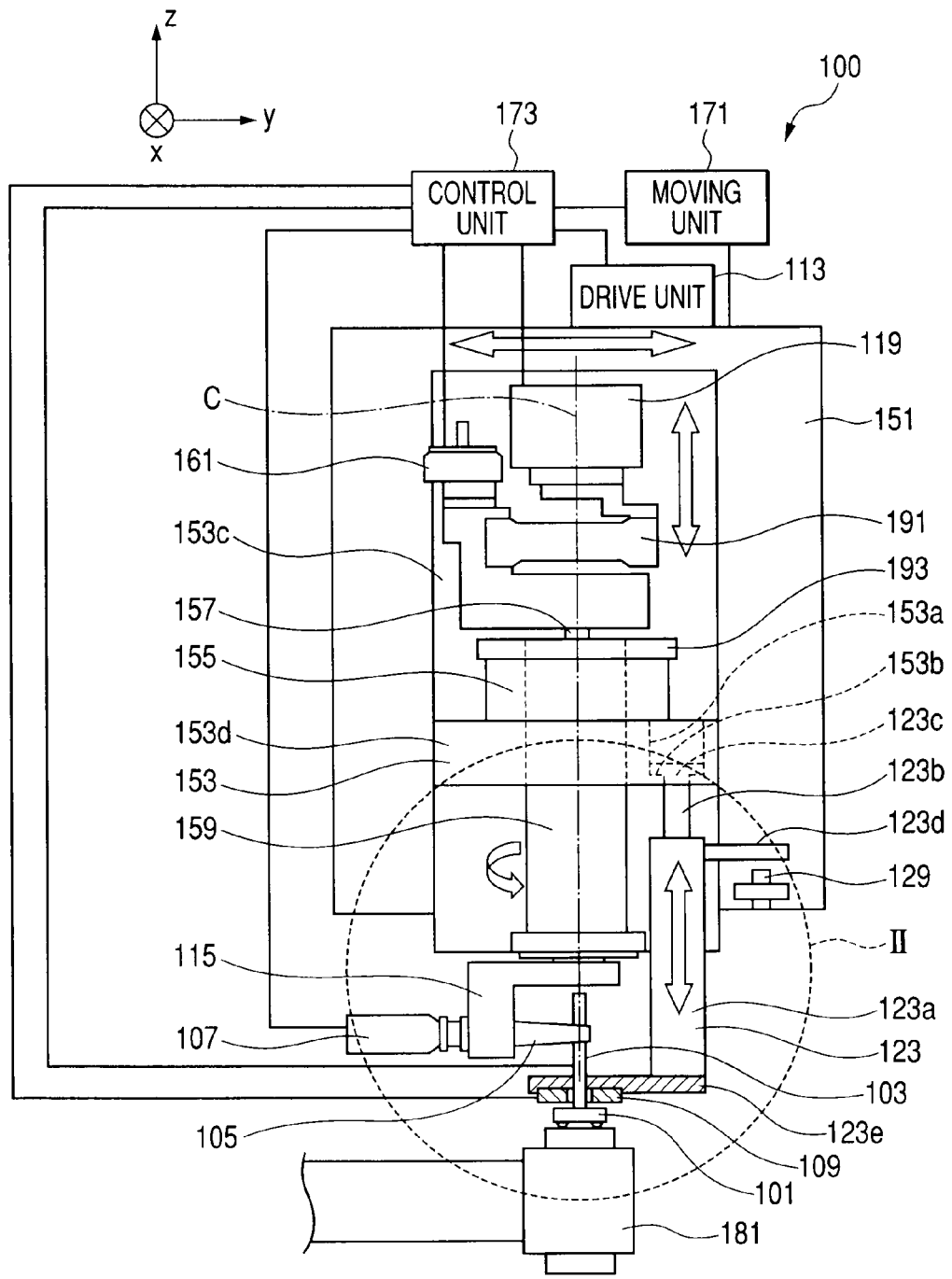
FIG. 1A is a partially sectional view in each mounting process of a mounting apparatus according to a first embodiment of the present invention.
Figure 1B:
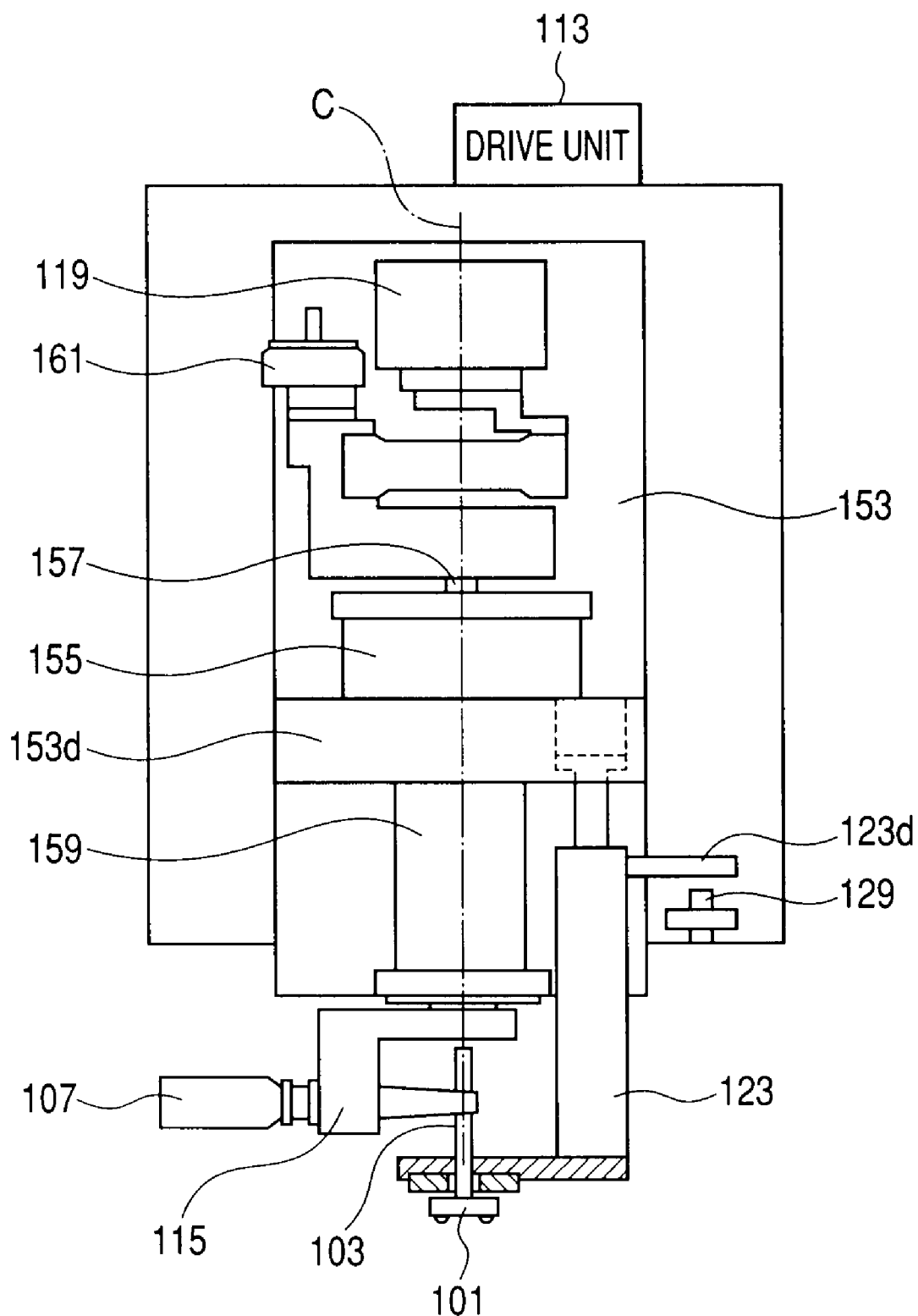
FIG. 1B is a partially sectional view in each mounting process of the mounting apparatus according to the first embodiment of the present invention.
Figure 1C:
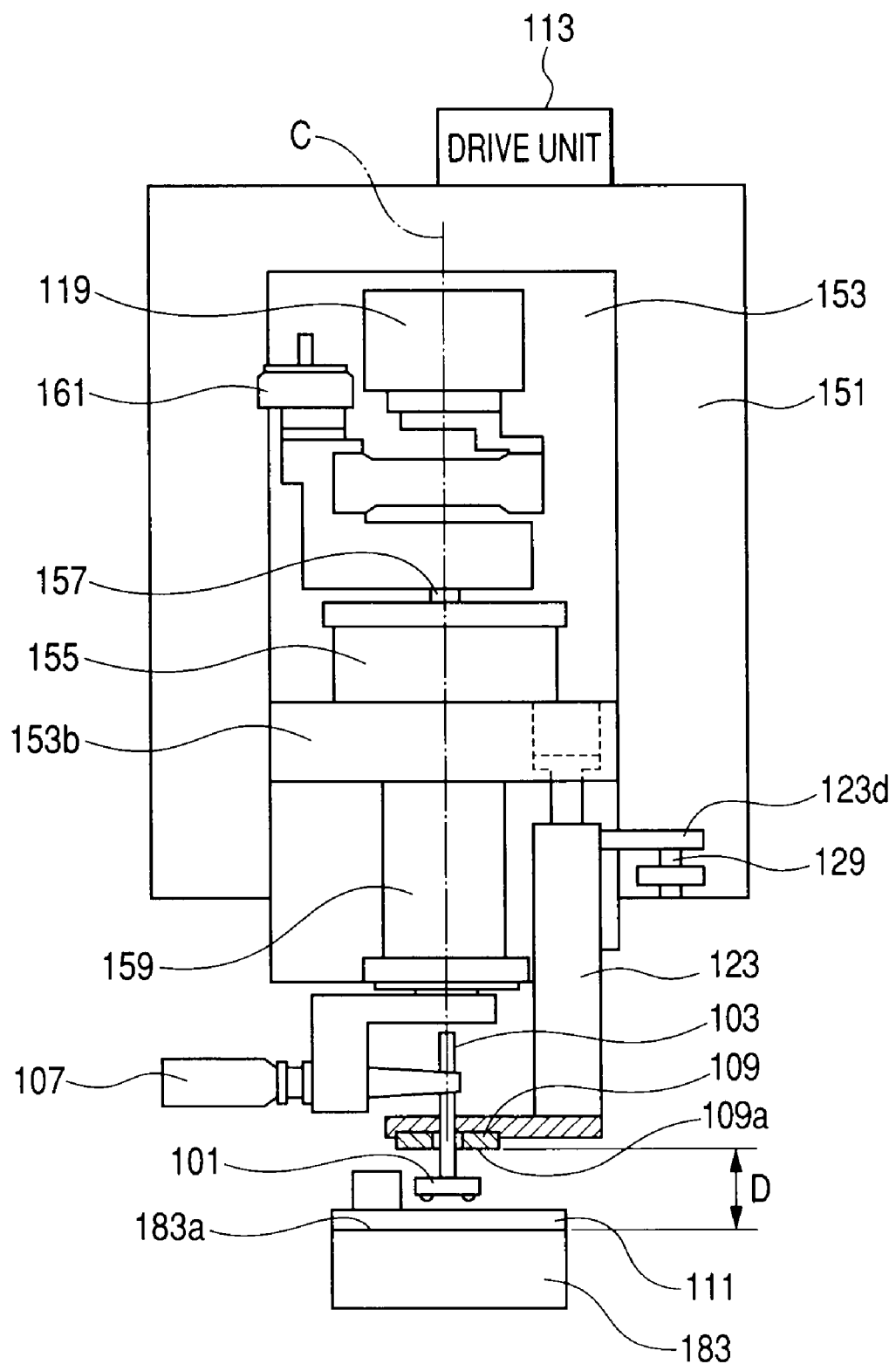
FIG. 1C is a partially sectional view in each mounting process of the mounting apparatus according to the first embodiment of the present invention.
Figure 1D:
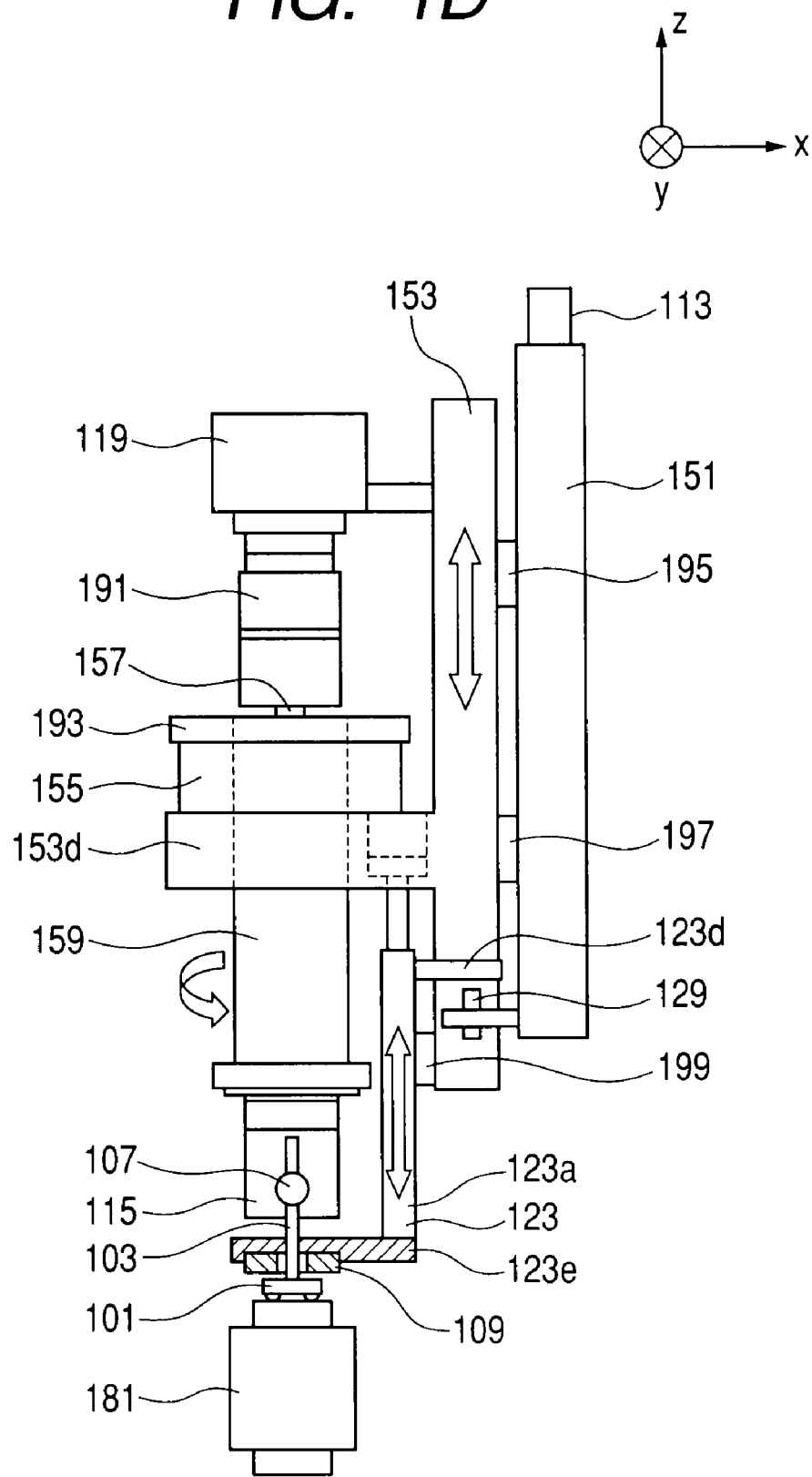
FIG. 1D is a side view of FIG. 1A.
Figure 2:
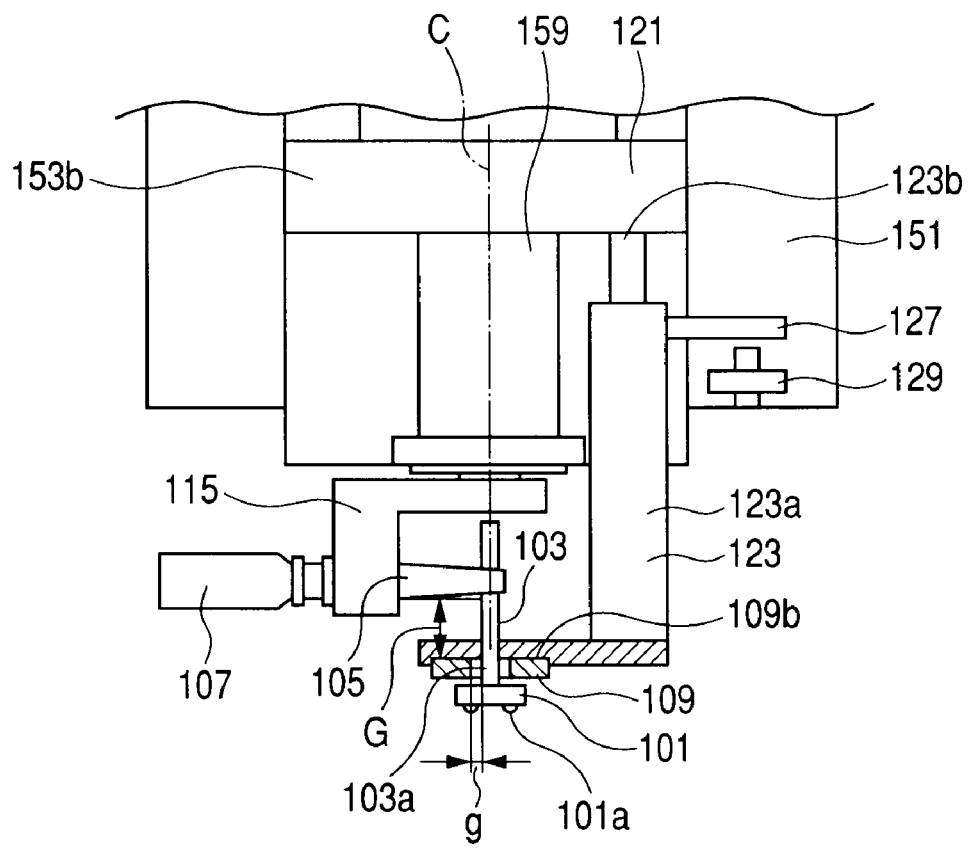
FIG. 2 is an enlarged view of a portion II in FIG. 1A.

An embodiment of a mounting apparatus, using ultrasonic vibration, according to the present invention will be described with referring to drawings. FIGS. 1A to 1C are partially sectional front views showing the mounting apparatus of an electronic device in each step of mounting an electronic device, FIG. 1D is a side view of FIG. 1A, and FIG. 2 is a partially enlarged view showing a portion II of the mounting apparatus in FIG. 1A.

A mounting apparatus 100 mainly includes a suction nozzle 103 which is a chip holding tool, a holding portion 183, an ultrasonic vibrator 107 and an ultrasonic horn 105, a pressing unit 119, a heater 109, a driving unit 113 and a stopper 129.

The suction nozzle 103 constitutes the SMD holding unit holding an electronic device 101 which is the SMD, and the holding portion 183 constitutes the SMD receiving device holding unit holding the SMD receiving device which is a circuit board 111. Furthermore, the ultrasonic vibrator 107 and ultrasonic horn 105 constitute the vibration generating unit applying ultrasonic vibration to a contact portion between the electronic device 101 and circuit board 111.

The pressing unit 119 constitutes the pressing unit which applies a bias force between the electronic device 101 and the circuit board 111, and the heater 109 constitutes the heating unit which is movably arranged so as to surround in a noncontact manner a front end 103a of the suction nozzle 103 near the electronic device 101, and which heats the suction nozzle 103.

In addition, the driving unit 113 constitutes the moving unit which moves the suction nozzle 103 close to or apart from the holding portion 183 so as to contact the electronic device 101 with circuit board 111, and a heater supporting portion 123 constitutes the interlocking unit interlocking the heater 109 with the suction nozzle 103 as mentioned later so as to move the heater 109 in conjunction with the suction nozzle 103.

Furthermore, the mounting apparatus 100 comprises a tabular supporting member 151 which extends in a vertical direction, and a slide member 153 is slidably connected to the supporting member 151 through slide guides 195 and 197.

The slide member 153 comprises a plate-like slide body 153c and a protruding portion 153d protruding from the slide body 153c. In the configuration of the slide member 153, a ball screw which is not shown extends along a longitudinal direction of the supporting member 151, and is screwed in a screw nut which is connected to the slide member 153. Hence, when the ball screw is rotated by the driving unit 113 such as a stepper motor, the slide member 153 moves in an up-and-down direction (in the z direction) in the drawing.

A DD (Direct Drive) motor 155 having a cylindrical housing which is rotary driving unit is fixed to the slide member 153, and a shaft 157 is disposed inside the DD motor 155. A cylindrical rotation member 159 is disposed rotatably and slidably through a through hole which is not shown and is provided in the protruding portion 153d of the slide member 153, and is rotatable also about the shaft while abutting against one end of the shaft 157. Furthermore, the cylindrical rotation member 159 is connected to a rotary piece 193 of the DD motor 155, and is rotatable. Hence, a turning force of the DD motor 155 is transmitted to the suction nozzle 103 through the cylindrical rotation member 159 and an adapter 115. By rotating the suction nozzle 103 by the DD motor 155, it becomes possible to perform positioning of the electronic device 101 held by suction with respect to a rotation direction (a direction of an arrow shown near the cylindrical rotation member in the figure). In addition, the shaft 157 and suction nozzle 103 are disposed concentrically about a central axis C. The ultrasonic horn 105 is connected to a bottom end portion of the cylindrical rotation member 159 through the L-shaped adapter 115.

The ultrasonic horn 105 extends in the lateral direction (y direction) in FIGS. 1A to 1D, and the ultrasonic vibrator 107 is mounted in its one end. In addition, the suction nozzle 103 extending in the vertical direction (z direction) is fixed to another end of the ultrasonic horn 105.

The suction nozzle 103 is connected to a suction source not shown, and holds the electronic device 101 by suction force in the front end 103a by applying a suction force to the electronic device 101 from a suction hole provided in an end face of the front end 103a of the suction nozzle 103.

Furthermore, the heater 109 is disposed around the front end 103a of the suction nozzle 103. The heater 109 has a toroidal shape, whose inner diameter is configured larger than the external diameter of the front end 103a of the suction nozzle 103. In addition, since the suction nozzle 103 and heater 109 are disposed concentrically (they have a common center line C), the suction nozzle 103 and heater 109 are in (noncontact) positional relation of being mutually separated in a predetermined interval in a radial direction. Thus, since the heater 109 which is the heating unit, and the suction nozzle 103 which is the holding unit never contact mutually, and are in a state of being always separated, it is possible to make heat capacity of the object to be heated in the heater 109 constant, and hence, heating control becomes easy.

The heater 109 is fixed to the slide member 153 through the approximately reverse L-shaped heater supporting portion 123, and is movable in the vertical direction (the z direction). The heater supporting portion 123 is mounted in the heater 109, and the heater supporting portion 123 comprises a horizontal portion 123e which horizontally extends, and a vertical portion 123a which extends in the vertical direction from one end of the horizontal portion 123e. A cylindrical engagement portion 123b whose cross-section of T-shape is provided in a protruding manner in an end of the vertical portion 123a, and the engagement portion 123b is contained slidably in the z direction in the holding opening 153a bored in the protruding portion 153d of the slide member 153. In addition, since a larger diameter portion 123c of the engagement portion 123b engages with a base 153b of the holding opening 153a, the engagement portion 123b never falls out from the holding opening 153a of the slide member 153 downward in the z direction. Furthermore, the heater supporting portion 123 is slidably supported by a slide guide 199 provided below the slide body 153c of the slide member 153.

Hence, in a state that the engagement portion 123b engages with the base 153b, the heater 109 moves in the z direction with being interlocked with the movement of the slide member 153 in the z direction. Furthermore, when the engagement of the engagement portion 123b and the base 153b is released, the suction nozzle 103 is also relatively movable with respect to the heater 109.

Furthermore, the heater supporting portion 123 has a stopper engagement portion 123d extending in the y direction. The stopper engagement portion 123d is configured to be locked by the stopper 129 provided in the supporting member 151. That is, when the stopper engagement portion 123d and stopper 129 engage with each other, even if the slide member 153 descends further, the heater supporting portion 123 does not descend. Therefore, the interlock between the suction nozzle 103 fixedly connected to the slide member 153 and the heater 109 connected to the heater supporting portion 123 is released.

Thus, the stopper 129 constitutes the interlock release unit, which releases the interlock between the heater 109 and suction nozzle 103 lest the heater 109 should approach more nearly than a predetermined distance D to the holding portion 183. By providing the interlock release unit, it is possible to heat the electronic device through the suction nozzle 103 until just before mounting, and to maintain suitable junction temperature.

In addition, it goes without saying that it is possible to suitably set a perpendicular (z-directional) distance D between a bottom face 109a of the heater 109 and a top face 183a of the holding portion 183 according to the dimensions of the SMD and SMD receiving device and a heating value of the heating unit.

Furthermore, the pressing unit 119, which is fixed to the slide member 153 and applies a bias force between the electronic device 101 held by the suction nozzle 103 and the circuit board 111, is disposed above the slide member 153. A lock unit 161 in the drawing is for fixing an output movable member (such as a coil mentioned later) of the pressing unit 119 to the slide member 153, or releasing fixation. Hence, when the locking unit is operated and the slide member 153 is fixed, a pressing force is not transmitted to the suction nozzle, but when the locking unit is made non-operative and the slide member 153 is released, a load of the pressing unit 119 is transmitted to the suction nozzle 103.

A publicly-known voice coil motor (VCM) which is constituted by a coil, which is wound around a blanket, a permanent magnets, and the like is used for the pressing unit 119. The coil itself which is the output movable member moves according to an action by a fixed frequency of current which flows through the coil, and a magnetic field by the permanent magnet, and applies the bias force in a radial direction (the z direction) to the shaft 157 through a pressing force detection unit 191 provided with a strain gage not shown. Hence, it is possible to apply the bias force between the electronic device 101 sucked and held by the suction nozzle 103 and the circuit board 111 placed on the holding portion 183.

Furthermore, the mounting apparatus 100 comprises a moving unit 171 and a control unit 173. The moving unit 171 is a member for moving the supporting member 151 in the x direction and the y direction to position the mounting apparatus. It is possible to adopt various publicly-known constructions for the moving unit 171, and its detail is omitted.

The control unit 173 is a member for managing operations of the mounting apparatus, and includes a CPU, ROM, RAM, an A/D converter, various I/F, and the like. The control unit 173 performs various computing processes on the basis of a predetermined program using various kinds of information, including an input signal, a stored value, and the like, and controls the operations of the suction nozzle 103, vibrator 107, driving unit 113, pressing unit 119, heater 123, motor 161, moving unit 171, and the like which are described above. In addition, from the standpoint of clarification of drawings, descriptions of the moving unit 171 and control unit 173 are omitted from other drawings excluding FIG. 1A.

A mounting method of an electronic device using the mounting apparatus with the above-mentioned construction will be described. First, the mounting apparatus 100 performs the suction holding of the electronic device 101 placed on a transfer member 181 which transfers the electronic device by the suction nozzle 103 (see FIG. 1A). Here, the control unit 173 operates the heater 109, heats the front end 103a of the suction nozzle 103, and heats the electronic device 101 through the suction nozzle 103. In addition, it is needless to say that the suction nozzle 103 may be heated by the heater 109 before performing the suction-holding by the suction nozzle 103.

Having received a drive signal from the control unit 173 while the electronic device 101 is sucked and held by the suction nozzle 103, the moving unit 171 moves the supporting member 151 toward the holding portion 183 where the circuit board 111 is fixed. Furthermore, on the basis of the image information from a camera not shown and the like, the control unit 173 operates the moving unit 171 and positions the supporting member 151 above the circuit board 111 so as the bumps 101a of the electronic device 101 to be positioned in predetermined positions.

Next, the electronic device 101 is positioned to its mounting position on the circuit board 111. First, the driving unit 113 is operated to lower the slide member 153 (moving downward in the z direction) so that the suction nozzle 103 is brought close to the holding portion 183. At this time, the heater 109 descends integrally with the descent of the suction nozzle 103.

Furthermore, when the suction nozzle 103 is lowered and a distance between the top face 183a of the holding portion 183 and the bottom face 109a of the heater 109 reaches the predetermined distance D in the vertical direction, the stopper engagement portion 123d mounted in the supporting portion 123 engages with the stopper 129, and the interlock between the suction nozzle 103 and heater 109 is released. After the release, only the suction nozzle 103 descends with the descent of the slide member 153 (FIG. 1C).

Then, after the electronic device 101 and circuit board 111 contact to each other, the output movable member is released by the locking unit 161, the pressing unit 119 is driven, and the electronic device 101 is pressed at a predetermined pressure to the circuit board 111. With synchronizing with this pressing process, the vibrator 107 is driven and the ultrasonic vibration is applied to the junction between the electronic device 101 and circuit board 111. Then, after specified time elapses, the operations of the pressing unit 119, vibrator 107, and heater 109 are stopped, and the ultrasonic bonding is completed.

In addition, as shown in the partially enlarged view of the portion II of FIG. 2, the mounting apparatus according to the present invention has the positional relation which satisfies G>g, where G represents the minimum distance between the top face 109b of the heater 109 and the outer peripheral surface of the ultrasonic horn 105 and g represents the minimum distance between the outer peripheral surface of the suction nozzle 103 and the inner peripheral surface of the heater 109. Since the heat of the heater 109, therefore, becomes easy to conduct toward the front end 103a of the suction nozzle 103, it is possible to suppress to the minimum an influence of the heat from the heater 109 on an element which constitutes the ultrasonic vibration generating unit.

Having completed the bonding, the suction force by the suction nozzle 103 onto the electronic device 101 is stopped, the slide member 153 is raised to release the electronic device 101 from the suction nozzle 103. In the process of raising the suction nozzle 103, when the larger diameter portion 123c of the engagement portion 123b engages with the base 153b of the holding hole 153a (namely, when the heater 109 is apart from the holding portion 183 by the predetermined distance D), the heater 109 ascends with interlocking with the suction nozzle 103.

By repeating the above-mentioned mounting operations, two or more electronic devices are sequentially mounted on an electronic circuit.

Thus, until just before bonding an electronic device to a circuit board, it is possible to heat the electronic device through a suction nozzle heated by heating unit. In consequence, it is possible to perform ultrasonic bonding in a state where the electronic device is maintained in the predetermined temperature suitable for ultrasonic bonding.

Second and third embodiments which are described below were done in view of that, since a vibrator which constructs vibration generating unit is weak in heat, predetermined vibration may not be obtained due to the change of oscillation characteristic of the vibrator depending on the heat.

Second Embodiment

Figure 3:
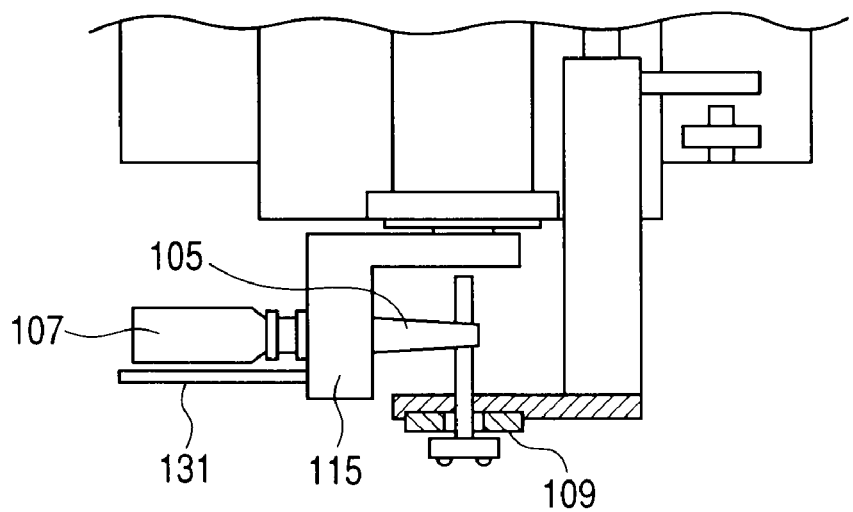
FIG. 3 is an enlarged partially sectional view of a principal part of a second embodiment according to the present invention.

FIG. 3 is a partially enlarged sectional view of a principal device of a mounting apparatus of the second embodiment.

The mounting apparatus of the second embodiment comprises thermal shield unit disposed between the heater 109 and vibrator 107 in order to shield the heat from the heater 109 to the vibrator 107. In addition, since components other than the thermal shield unit are the same as those of the mounting apparatus according to the first embodiment shown in FIGS. 1A to 1D and FIG. 2, their details will be omitted.

The tabular plate member 131 which is thermal shield unit extends in the y direction in the drawing between the vibrator 107 and heater 109 and is fixed to the adapter 115. Since it is possible to prevent the heat from conducting to the vibrator which constructs ultrasonic vibration generating unit by providing the plate member 131, it is possible to generate stably predetermined ultrasonic vibration. In addition, the horizontal portion 123e of the heater supporting portion 123 also functions as the heat shielding unit. Needless to say, the horizontal portion of the heater supporting portion shown in FIGS. 1A to 1D, 2 and 4 functions as the heat shielding unit similarly.

Furthermore, it is possible to prevent the heat radiation toward a prescribed direction from the heater 109 by the plate member 131, and it is possible to use the heat from the heater 109 effectively. In addition, the thermal shield unit makes attach/detach easy by using simple construction of the tabular plate member, and never worsens maintainability, such as exchange of the vibrator or the ultrasonic horn of the mounting apparatus.

Third Embodiment

Figure 4:
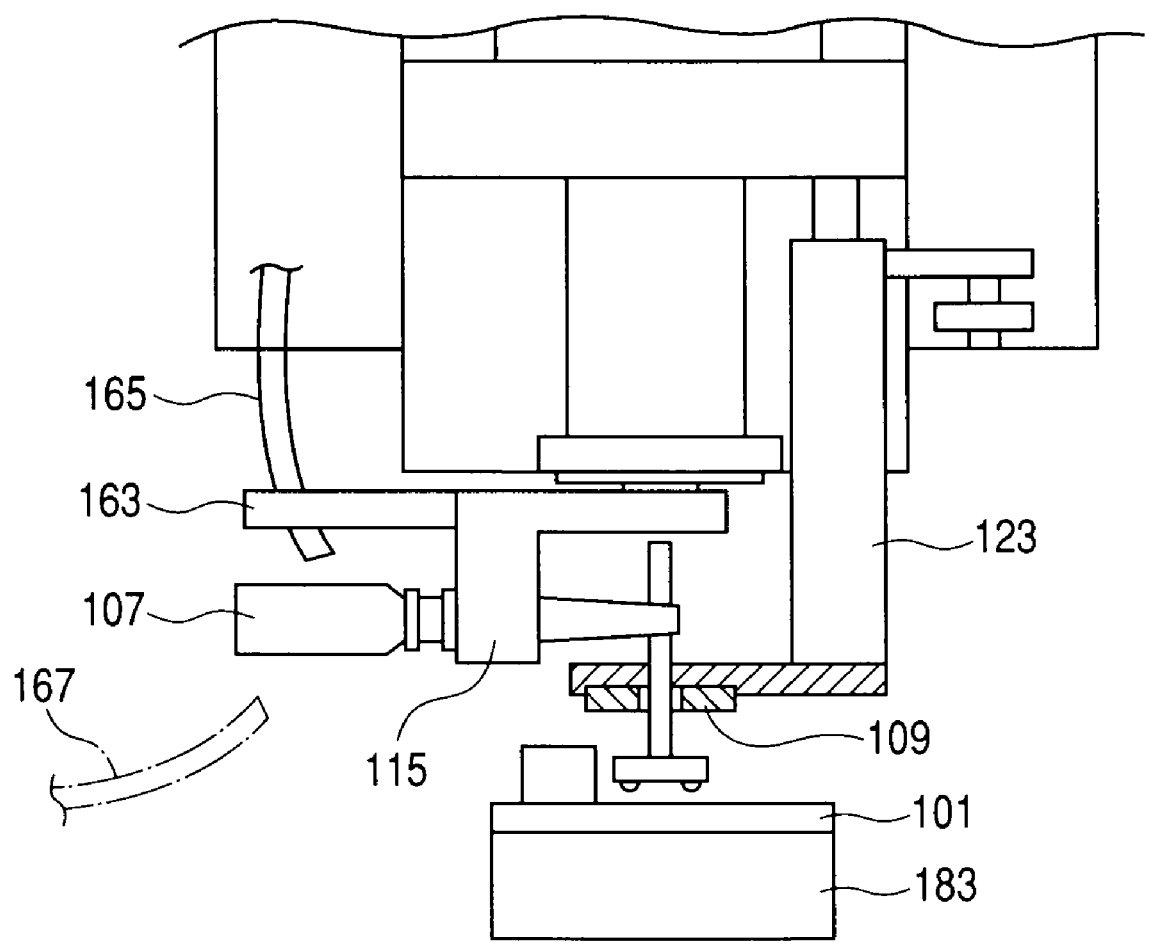
FIG. 4 is an enlarged partially sectional view of a principal part of a third embodiment according to the present invention.
Figure 5A:
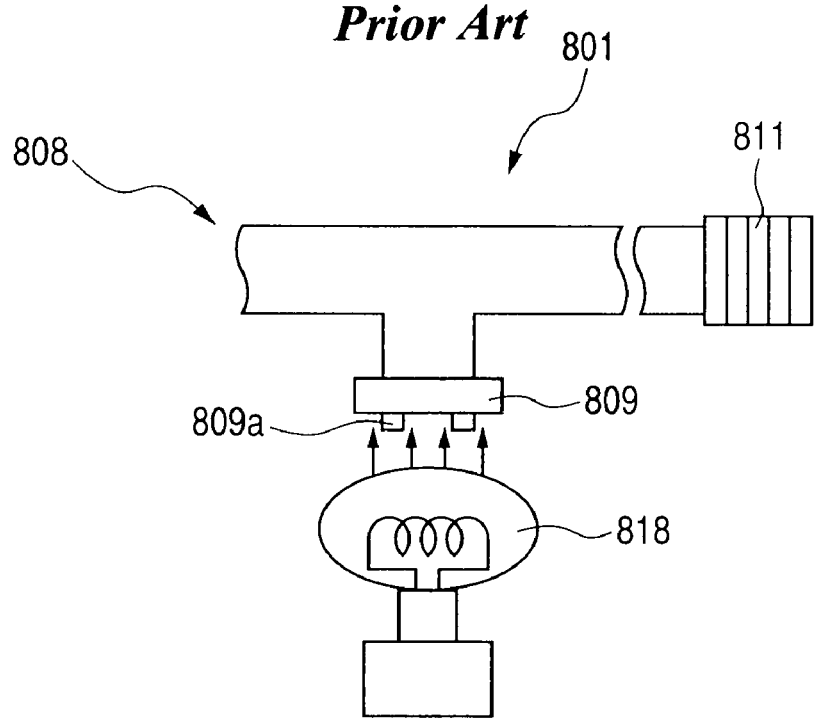
FIG. 5A is a diagram showing each mounting step of a conventional mounting apparatus.
Figure 5B:
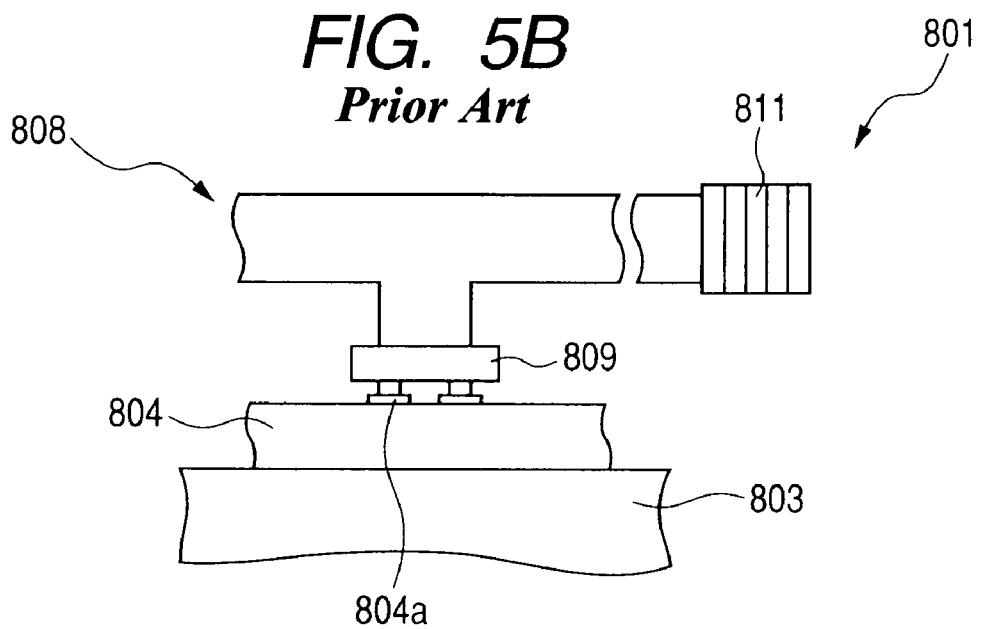
FIG. 5B is a diagram showing each mounting step of the conventional mounting apparatus.

A third embodiment has construction of providing an air supply unit, which is thermal shield unit, in the mounting apparatus according to the first embodiment. FIG. 4 is a partially enlarged sectional view of a principal device of the mounting apparatus according to the third embodiment. An air supply tube 165 which constitutes the thermal shield unit is arranged above the vibrator 107 in the drawing, and is fixed to a tube fixing portion 163 provided in the heater supporting portion 115. That is, air from the air supply tube 165 forms an airflow downward from above the vibrator 107. It is possible to cool the vibrator 107, or to prevent the heat from transferring from the heater 109 to the vibrator 107, according to this construction.

In addition, it is needless to say that it is possible to change the disposition of the air supply tube suitably. For example, the air supply tube 167 shown by an alternate long and short dashed line is arranged below and near the vibrator 107. The air from the air supply tube 167 forms an airflow which flows between the vibrator 107 and heater 109, and the airflow cools the vibrator 107 from a side near the heater 109. According to this construction, it is possible to positively prevent the heat from the heater 109 from conducting to the vibrator 107 without obstructing the heating of an electronic device and the front end 103a of the suction nozzle 103. Furthermore, it is possible to prevent the diffusion of the heat upward from the heater 109.

Furthermore, a cooling member can be mentioned as another aspect of the thermal shield unit. For example, it is possible to provide a cooling member of a configuration in which a cooling tube is made to extend around or near the vibrator 107 and a coolant, such as water, is flowed in the cooling tube. When the heat of the vibrator 107 is made to conduct to the coolant in the cooling tube, it is possible to prevent the heat from conducting from the heater 109 to the vibrator 107.

In addition, it is needless to say that it is possible to form a mounting apparatus obtained by combining the second embodiment and third embodiment.

In the first to third embodiments, although it is made to use construction of raising and lowering the suction nozzle and the heater with interlocking mutually by a driving unit, or raising and lowering the suction nozzle independently, the present invention is not limited to this construction. That is, it is needless to say that it is also possible to use a construction in which the suction nozzle and the heater are provided with the respective driving units, only the suction nozzle is moved when the distance between the heater and the holding portion is within the predetermined distance D, and both driving units are synchronized by a control unit to integrally move the heater and driving unit when they are apart from each other more than the predetermined distance D.

This invention can be embodied as many types of things without deviating from its essential character. Therefore, it is needless to say that the embodiments mentioned above are what are for descriptions chiefly and they are not what restrict the present invention.

This application claims priority from Japanese Patent Application No. 2007-197423 filed on Jul. 30, 2007 which is hereby incorporated by reference herein.

What is claimed is:

1. A mounting apparatus which mounts a surface-mounted device (SMD) on a SMD receiving device using ultrasonic vibration, comprising:
    a SMD holding unit holding the SMD;
    a SMD receiving device holding unit holding the SMD receiving device;
    a moving unit moving at least one of the SMD holding unit and the SMD receiving device holding unit toward the other so as to contact the SMD with the SMD receiving device;
    a vibration generating unit applying ultrasonic vibration to a contact portion between the SMD held by the SMD holding unit and the SMD receiving device held by the SMD receiving device holding unit;
    a pressing unit applying a bias force between the SMD and the SMD receiving device;
    a heating unit being arranged movably so as to surround in a noncontact manner a portion of the SMD holding unit near the SMD held by the SMD holding unit, and heating the SMD holding unit;
    an interlocking unit interlocking the heating unit with the SMD holding unit; and
    an interlock release unit releasing interlock of the heating unit lest the heating unit and the SMD receiving device holding unit holding the SMD receiving device should approach mutually more nearly than a predetermined distance.

2. A mounting apparatus which mounts a surface-mounted device (SMD) on a SMD receiving device using ultrasonic vibration, comprising:
    a SMD holding unit holding the SMD;
    a SMD receiving device holding unit holding the SMD receiving device;
    a moving unit moving at least one of the SMD holding unit and the SMD receiving device holding unit toward the other so as to contact the SMD with the SMD receiving device;
    a vibration generating unit applying ultrasonic vibration to a contact portion between the SMD held by the SMD holding unit and the SMD receiving device held by the SMD receiving device holding unit;
    a pressing unit applying a bias force between the SMD and the SMD receiving device;
    a heating unit being arranged movably so as to surround in a noncontact manner a portion of the SMD holding unit near the SMD held by the SMD holding unit, and heating the SMD holding unit; and
    an interlocking unit interlocking the heating unit with the SMD holding unit,
    wherein the SMD holding unit comprises a suction nozzle which holds the SMD by a suction force, and the heating unit comprises a heater member of a toroidal shape which surrounds an outer peripheral surface of the suction nozzle.

3. The mounting apparatus according to claim 1, wherein the interlock release unit comprises a regulating member which locks the heating unit.

4. The mounting apparatus according to claim 1, further comprising a thermal shield unit shielding heat from the heating unit to the vibration generating unit.

5. The mounting apparatus according to claim 4, wherein the thermal shield unit comprises a tabular member extending between the heating unit and the vibration generating unit.

6. The mounting apparatus according to claim 4, wherein the thermal shield unit comprises an air supply unit which supplies air to the vibration generating unit.

7. The mounting apparatus according to claim 4, wherein the thermal shield unit comprises an air supply unit which forms an airflow between the heating unit and the vibration generating unit.

* * * * *